United States Patent
Shiota

Patent Number: 5,757,860
Date of Patent: May 26, 1998

[54] SYNTHESIZER RECEIVER

[75] Inventor: Shinichi Shiota, Tokyo, Japan

[73] Assignee: Sony Corporation, Tokyo, Japan

[21] Appl. No.: 699,937

[22] Filed: Aug. 20, 1996

[30] Foreign Application Priority Data

Aug. 31, 1995 [JP] Japan ................. 7-246716

[51] Int. Cl.$^6$ .............. H03K 9/00; H04L 27/06; H04L 27/14; H04L 27/22

[52] U.S. Cl. ............. 375/316; 455/180.3; 455/179.1; 455/186.1; 455/183.1

[58] Field of Search ............. 375/316; 455/186.1, 455/185.1, 183.1, 260, 179.1, 180.3; 340/825.5, 825.51

[56] References Cited

U.S. PATENT DOCUMENTS

| | | | |
|---|---|---|---|
| 3,882,400 | 5/1975 | Hamada | 325/456 |
| 4,048,570 | 9/1977 | Sumi | 325/459 |
| 4,081,752 | 3/1978 | Sumi | 325/335 |
| 4,088,959 | 5/1978 | Sumi | 325/459 |
| 4,222,121 | 9/1980 | Matsumoto et al. | 455/164 |
| 4,236,251 | 11/1980 | Ohgishi et al. | 455/180 |
| 4,298,851 | 11/1981 | Shichigo et al. | 334/11 |
| 4,306,309 | 12/1981 | Yasuda | 455/183 |
| 4,352,204 | 9/1982 | Ohgishi et al. | 455/182 |
| 4,355,412 | 10/1982 | Kawakami | 455/175 |
| 4,380,826 | 4/1983 | Usugi | 455/165 |
| 4,466,127 | 8/1984 | Ohgishi et al. | 455/182 |
| 5,077,833 | 12/1991 | Shiota | 455/173 |
| 5,130,676 | 7/1992 | Mutz | 332/100 |
| 5,537,674 | 7/1996 | Kishimoto et al. | 455/186.1 |
| 5,628,061 | 5/1997 | Shirakawa | 455/186.1 |

FOREIGN PATENT DOCUMENTS

| | | | |
|---|---|---|---|
| 0389012 | 9/1990 | European Pat. Off. | H03J 5/02 |
| 4305483 | 6/1994 | Germany | H03J 5/00 |
| 2244401 | 11/1991 | United Kingdom | H03J 5/00 |
| 9103102 | 3/1991 | WIPO | H03J 5/02 |

Primary Examiner—Stephen Chin
Assistant Examiner—Mohammad Ghayour
Attorney, Agent, or Firm—Jay H. Maioli

[57] ABSTRACT

A synthesizer receiver for performing frequency conversion of a received signal using a signal formed in a PLL and altering a frequency division ratio of a variable frequency dividing circuit of said PLL, thereby to alter the frequency of said signal so as to change a receiving frequency, provided with: memories for storing data of the receiving frequency in each of a plurality of data areas; station selecting means having a plurality of station selector keys corresponding to the plurality of data areas of the memory, wherein, from a data area corresponding to the operated station selector key, the receiving data stored in this data area are read out so that the receiving frequency is selected; and data moving means having a buffer area for saving the data of the receiving frequency stored in the data area, wherein, when one data area among the plurality of data areas is selected and established, and thereafter, another data area among the plurality of data areas is selected and established, the data of the receiving frequency stored in that one data area are saved in the buffer area and a vacant area is formed in that another data area, and the receiving frequency data that have been saved in the buffer area are returned to that another data area.

3 Claims, 5 Drawing Sheets

| PAGE A | | | | | | PAGE B | | | | PAGE C | | | | | | | |
|---|---|---|---|---|---|---|---|---|---|---|---|---|---|---|---|---|---|
| A0 | A1 | A2 | A3 | - - - | A9 | B0 | - - - - - | B9 | C0 | - | C3 | C4 | C5 | C6 | - | C9 |
| NA | NB | NC | ND | - - - | NJ | NK | - - - - - | NT | NU | - | NX | NY | NZ | - | - | - |

FIG. 2B

| A0 | A1 | A2 | A3 | - - - | A9 | B0 | - - - - - | B9 | C0 | - | C3 | C4 | C5 | C6 | - | C9 |
|---|---|---|---|---|---|---|---|---|---|---|---|---|---|---|---|---|
| NA | NB | NC | ND | - - - | NJ | NK | - - - - - | NT | NU | - | NX |  | NZ | - | - | - |

~BUFF

FIG. 2C

| A0 | A1 | A2 | A3 | - - - | A9 | B0 | - - - - - | B9 | C0 | - | C3 | C4 | C5 | C6 | - | C9 |
|---|---|---|---|---|---|---|---|---|---|---|---|---|---|---|---|---|
| NA |  | NB | NC | - - - | NI | NJ | - - - - - | NS | NT | - | NW | NX | NZ | - | - | - |

FIG. 2D

| A0 | A1 | A2 | A3 | - - - | A9 | B0 | - - - - - | B9 | C0 | - | C3 | C4 | C5 | C6 | - | C9 |
|---|---|---|---|---|---|---|---|---|---|---|---|---|---|---|---|---|
| NA | NY | NB | NC | - - - | NI | NJ | - - - - - | NS | NT | - | NW | NX | NZ | - | - | - |

☐~BUFF

| PAGE A | | | | | | | PAGE B | | | | PAGE C | | | | | | |
|---|---|---|---|---|---|---|---|---|---|---|---|---|---|---|---|---|---|
| A0 | A1 | A2 | A3 | - | - | - | A9 | B0 | - | - | - | - | B9 | C0 | - | C3 | C4 | C5 | C6 | - | C9 |
| NA | NB | NC | ND | - | - | - | NJ | NK | - | - | - | - | NT | NU | - | NX | NY | NZ | - | - | - |

FIG. 5B PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | NB | NC | ND | - | - | - | NJ | NK | - | - | - | - | NT | NU | - | NX | NY | NZ | - | - | - |

FIG. 5C PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | | NC | ND | - | - | - | NJ | NK | - | - | - | - | NT | NU | - | NX | NY | NZ | - | - | NB |

FIG. 5D PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | | NC | ND | - | - | - | NJ | NK | - | - | - | - | NT | NU | - | NX | NY | NZ | - | - | NB |

FIG. 5E PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | NY | NC | ND | - | - | - | NJ | NK | - | - | - | - | NT | NU | - | NX | | NZ | - | - | NB |

FIG. 5F PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | NY | | NC | - | - | - | NI | NJ | - | - | - | - | NS | NT | - | NW | NX | NZ | - | - | NB |

FIG. 5G PRIOR ART

| A0 | A1 | A2 | A3 | - | - | - | A9 | B0 | - | - | - | - | B9 | C0 | - | C3 | C4 | C5 | C6 | - | C9 |
|---|---|---|---|---|---|---|---|---|---|---|---|---|---|---|---|---|---|---|---|---|---|
| NA | NY | NB | NC | - | - | - | NI | NJ | - | - | - | - | NS | NT | - | NW | NX | NZ | - | - | |

SYNTHESIZER RECEIVER

BACKGROUND OF THE INVENTION

1. Field of the Invention

The present invention relates to a synthesizer receiver having a preset function.

2. Description of the Related Art

In general, a synthesizer receiver using a phase locked loop (PLL) is able to preset a receiving frequency to a station selector key, so that, when the station selector key is pushed, the frequency which is preset to the pushed key may be selected.

In this case, the presetting is made by writing data of the receiving frequency such as a frequency division ratio of a variable frequency dividing circuit of a PLL in an address of a memory corresponding to the station selector key. Further, station selection is realized by reading the frequency division ratio out of the address corresponding to the pressed station selector key and setting it to the variable frequency dividing circuit.

Then, write to the memory for presetting of the frequency division ratio can be made by scanning. Namely, when an autopreset key is pushed, scanning of the AM broadcasting band for instance is started, and, when the broadcasting can be received during scanning, the data of the frequency (frequency division ratio) at that time are written in the memory successively.

Now, the scanning at time of presetting is generally started from the lowest frequency of the objective frequency band, and is performed so as to change toward the high frequency side. Therefore, when broadcasting stations are preset to station selector keys, the presetting is made in sequence of frequency of the broadcasting stations.

However, it makes harder for some users to use the unit sometimes when the broadcasting stations are preset in sequence of frequency. In a word, users have taste of their own in broadcasting and broadcasting stations, and there are broadcasting stations they listen to frequently and broadcasting stations they do not listen to so often. Then, when the broadcasting stations to which users listen in frequently and the broadcasting stations to which they do not listen in so often have been grouped, maneuverability at time of station selection is improved. However, the presetting is made in sequence of frequency of the broadcasting stations as described above, and not in order of taste of users. Thus, as a result, maneuverability does not become so high.

Therefore, it is being considered to make it possible to replace the order of preset broadcasting stations.

Figure 5A:
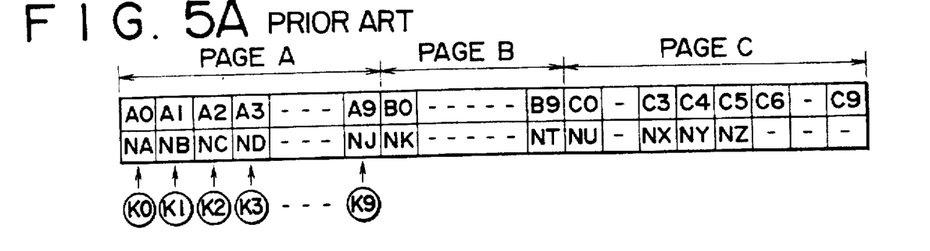
FIGS. 5A–5G is a diagram for explaining a conventional example.

Namely, it is assumed now that, as shown in FIG. 5A for instance, a memory for presetting has three pages A, B and C, and each of the pages A, B and C has ten data areas (addresses) A0 to A9, B0 to B9 and C0 to C9, respectively. Further, frequency division ratios NA to NZ are written in 26 pieces of data areas A0 to C5 from the head as data of receiving frequency, respectively, through the pages A to C. Thus, C6, C7, C8 and C9 are vacant areas where no data have been written.

Then, when a page key is pushed, the pages A, B and C are selected in the unit of page successively whenever it is pushed, and 10 pieces of station selector keys K0 to K9 are made to correspond to respective 10 pieces of data areas (areas A0 to A9, B0 to B9 and C0 to C9) of selected page, respectively.

When the frequency division ratio NY of the area C4 is moved to the area A1 for instance in such a state, the key operation and processing for such a purpose are as follows.

Namely:

(A) A page key is pushed several times so as to select the page A.

With this, the station selector keys K0 to K9 correspond to the areas A0 to A9 as shown in FIG. 5A.

(B) The station selector key K1 corresponding to the frequency division ratio NB is pushed, thereby to select the area A1.

(C) A memory key provided separately from the page key and the station selector key is pushed so as to prepare for the movement of the frequency division ratio NB.

(D) The page key is pushed twice so as to select the page C.

Figure 5B:
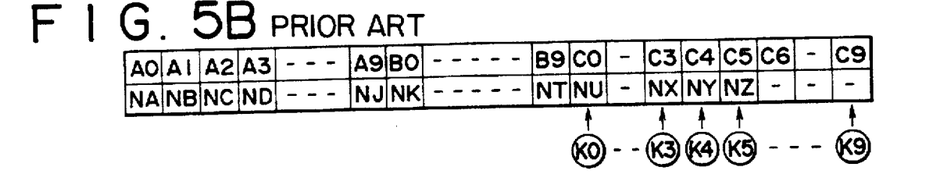

With this, the station selector keys K0 to K9 correspond to the areas C0 to C9 as shown in FIG. FB.

(E) The selector key K9 is pushed.

Figure 5C:
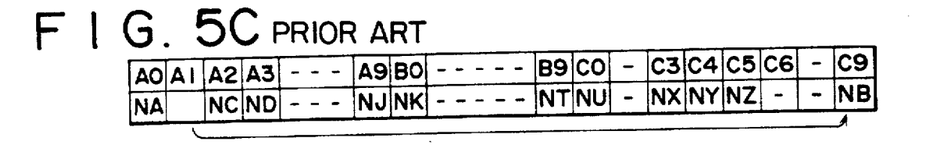

With this, the frequency division ratio NB of the area A1 is moved (saved) to the vacant area C9 as shown in FIG. 5C.

(F) Being the page C at present, the station selector key K4 corresponding to the frequency division ratio NY is pushed so as to select the area C4.

(G) The memory key is pushed so as to prepare for the movement of the frequency division ratio NY of the area C4.

(H) The page key is pushed once so as to select the page A.

Figure 5D:
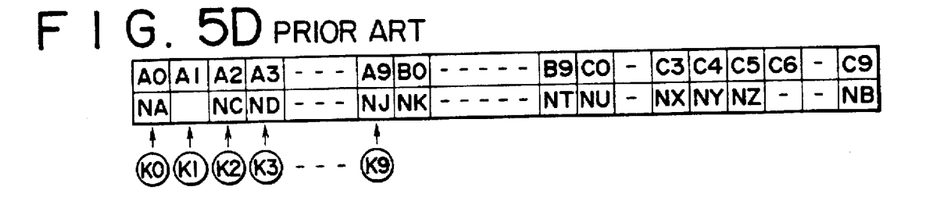

With this, the station selector keys K0 to K9 correspond to the areas A0 to A9 as shown in FIG. 5D.

(I) The selector key K1 is pushed.

Figure 5E:
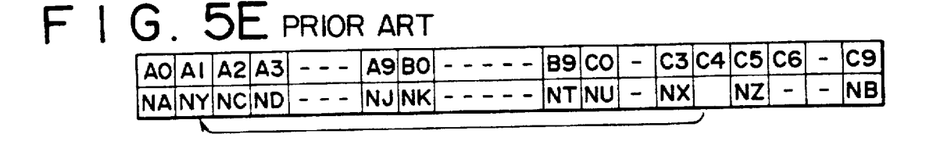

With this, the frequency division ratio NY of the area C4 is moved to the area A1 as shown in FIG. 5E.

Figure 5F:
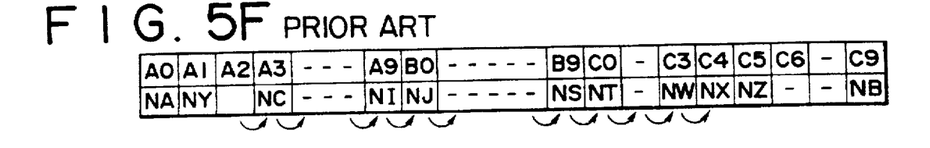

(J) By similar key operation, the frequency division ratio NX of the area C3 is moved to the area C4 as shown in FIG. 5F.

(K) The frequency division ratios NW to NC of the areas C2 to A2 are moved one by one to the back area in a similar manner thereafter as shown in FIG. 5F.

Figure 5G:
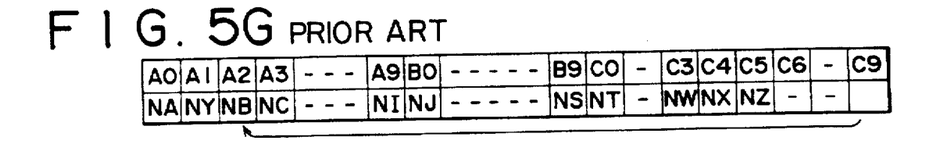

(L) Finally, the frequency division ratio NB of the area C9 is moved to the area A2 as shown in FIG. 5G.

With the foregoing, the frequency division ratio NY which has been located in the area C4 at first has moved to the area A1. Thus, it means that the broadcasting station which has been preset to the station selector key K4 in the page C has moved to the station selector key K2 of the page A.

However, as it is apparent from the foregoing and the description of FIG. 5, it is very troublesome to move the broadcasting station that is preset to the station selector key in a way described above. In addition, it happens sometimes that some users have their attention attracted to move the frequency division ratio NY of the area C4 to the area A1 (FIGS. 5D and 5E) and forget to where the frequency division ratio NB which has been located in the area A1 has been moved.

Further, when a mistake is made in key operation, the frequency division ratio which has been written in the data area is erased by superscription.

Furthermore, the vacant area C9 is used as a saving area of the frequency division ratio NB when the frequency division ratio NY is moved to the area A1, but the frequency division ratio cannot be moved when this area C9 is not vacant.

It is a matter of course in this case that the above-mentioned problem is solved when an area of a part of another memory is used as a saving area in place of using the area C9 as the saving area. In that case, however, since it is impossible to designate the saving area with the station selector key seeing from the user, another new key becomes necessary, and the key operation becomes still more troublesome.

SUMMARY OF THE INVENTION

It is an object of the present invention to solve such problems as described above.

Thus, according to the present invention, there is provided a synthesizer receiver for performing frequency conversion of a receiving signal using a signal formed in a PLL and altering a frequency division ratio of a variable frequency dividing circuit of the PLL, thereby to alter the frequency of the signal so as to change the receiving frequency, having:

memories for storing the data of the receiving frequency in a plurality of data areas, respectively;

a plurality of station selector keys;

keys for instructing movement; and a key for establishment; wherein, when one of the plurality of station selector keys is operated:

from a data area corresponding to the operated station selector key among the plurality of data areas of the memory, the data of the receiving frequency stored in the data area are read out;

the frequency division ratio of the variable frequency dividing circuit is set and a receiving frequency preset in the operated station selector key is selected in accordance with the read out data; and in case the key for instructing the movement is operated, when one data area (hereinafter referred to as a "data area of movement origin") among the plurality of data areas is selected, this data area is also established by means of the key for establishment, and another data area (hereinafter referred to as a "data area of the movement destination") among the plurality of data areas is selected after the establishment, and this data area is established by the key for establishment:

the data of the receiving frequency stored in the data area of the movement origin are saved in a buffer area;

the data of the receiving frequency stored in a data area between a data area of the movement origin and a data area of the movement destination (including the data area of the movement destination) are shifted by one data area at a time to the data area side of the movement origin; and the data of the receiving frequency which have been saved in the buffer area are returned to the area of the movement destination.

DESCRIPTION OF THE PREFERRED EMBODIMENT

Figure 1:
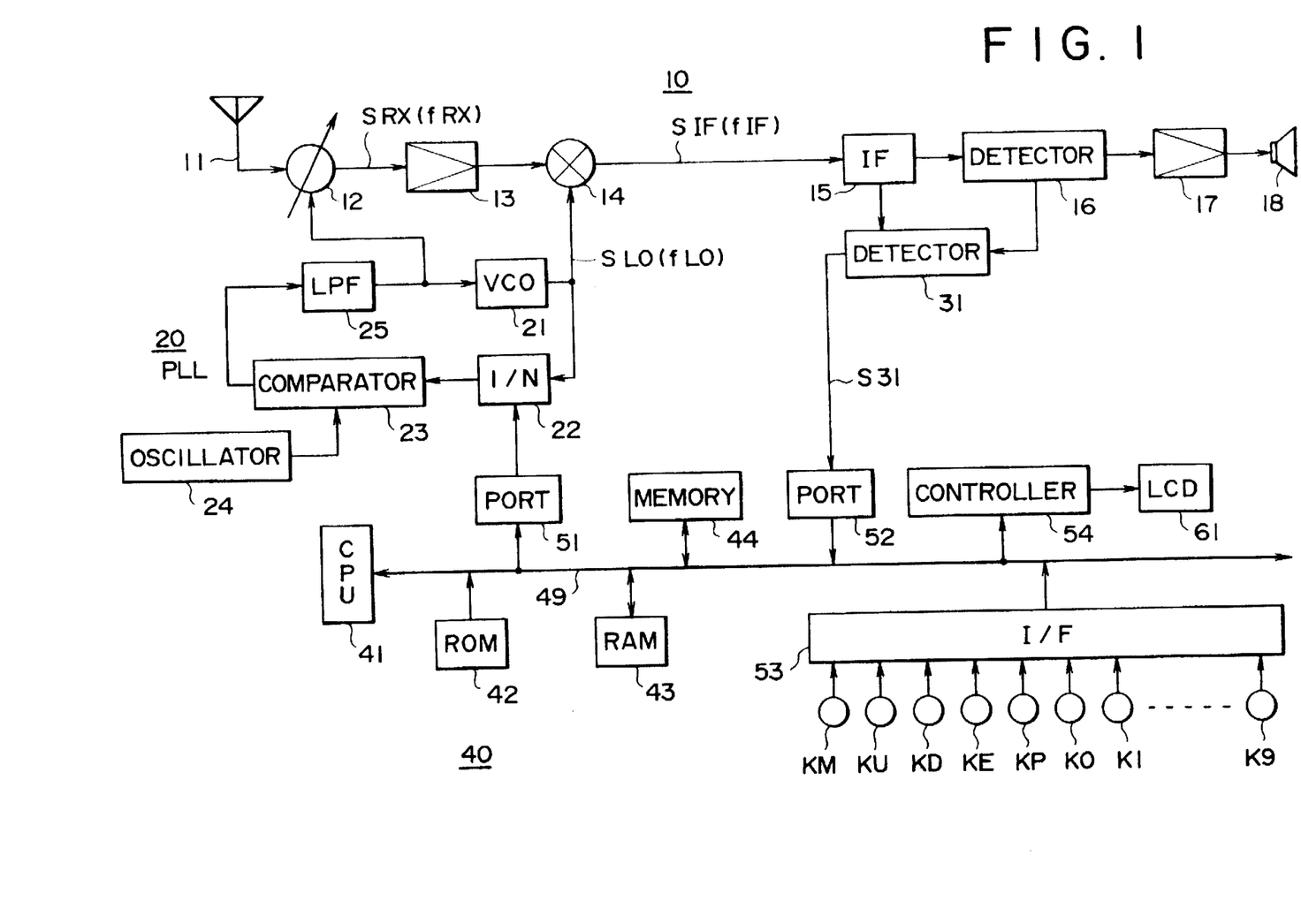
FIG. 1 is a system diagram showing configuration of the present invention.

FIG. 1 shows one of the cases that the present invention is applied to an AM receiver. A reference numeral 10 represents an AM receiver circuit constituted in a synthesizer system, and a received signal from an antenna 11 is supplied to an antenna tuning circuit 12 of an electronic tuning system and an objective broadcast wave signal SRX having a frequency fRX is taken out.

Then, this signal SRX is supplied to a mixer circuit 14 through a high-frequency amplifier 13, and an oscillation signal SLO having a frequency fLO such as:

$$fLO = fRX + fIF \ [kHz] \quad (i)$$

where, fIF is an intermediate frequency, which is 450 kHz for instance, is also taken out of VCO 21. This signal SLO is supplied to the mixer circuit 14 as a local oscillation signal, and the signal SRX is frequency-converted into an intermediate frequency signal SIF (intermediate frequency fIF).

Furthermore, this intermediate frequency signal SIF is supplied to an AM detection circuit 16 through an intermediate frequency amplifier 15 so as to demodulate an aural signal, and this signal is supplied to a speaker 18 through an amplifier 17.

At this time, the VCO 21 constitutes a phase-locked loop (PLL) 20 together with circuits 22 to 25. Namely, the signal SLO from the VCO 21 is supplied to the variable frequency dividing circuit 22 and the frequency thereof is divided into 1/N frequencies. This frequency divided signal is supplied to a phase comparison circuit 23, an oscillation signal of a reference frequency such as a frequency 9 kHz is taken out of the oscillation circuit 24, this oscillation signal is supplied to the comparison circuit 23, and the compared output is supplied to the VCO 21 as a control voltage thereof through a low-pass filter 25. Further, the output voltage of the filter 25 is supplied to the tuning circuit 12 as the station selecting voltage.

Thus, since the frequency dividing signal from the frequency dividing circuit 22 and the oscillation signal of the oscillation circuit 24 have an equal frequency in a stationary state, the frequency fLO of the oscillation signal SLO at this time becomes:

$$fLO = N \times 9 \ [kHz] \quad (ii)$$

From the expressions (i) and (ii), the following expression is obtained.

$$fRX = fLO - fIF = N \times 9 - 450 [kHz]$$

Accordingly, when the frequency division ratio N is changed by "1" at a time between 109 and 230, the local oscillation frequency fLO changes between 981 kHz and 2,070 kHz at intervals of 9 kHz. Therefore, the receiving frequency fRX is changed in a frequency band of 531 kHz to 1,620 kHz at frequency steps of 9 kHz and corresponding to the frequency division N.

Further, respective parts of the intermediate frequency signal SIF from the intermediate frequency amplifier 15 and the detected output of the detection circuit 16 are supplied to a detection circuit 31, and a detected signal S31 which becomes:

"1" when the receiving level of the broadcast wave signal SRX is at a predetermined value or higher, and "0" when the receiving level is less than a predetermined value, is taken out of the detection circuit 31.

Furthermore, a microcomputer 40 is provided in the present synthesizer receiver as a system control unit. Besides, an 8-bit microcomputer—PD-78044 manufactured by NEC Corporation was used as this microcomputer 40 in the present embodiment. This microcomputer 40 has a CPU 41, a ROM 42 for a program,, a RAM 43 for a work area and a memory 44 for storing preset frequency data. Then, the memories 42 to 44 are connected to the CPU 41 through a system bus 49.

In this case, as to the memory 44, a ROM capable of performing erase and write of data electrically is used, or, although it is not illustrated, a RAM backed up by a battery is used. Namely, a nonvolatile memory is used for the memory 44, so that written data may be held even when the power supply is turned off.

Figure 2A:
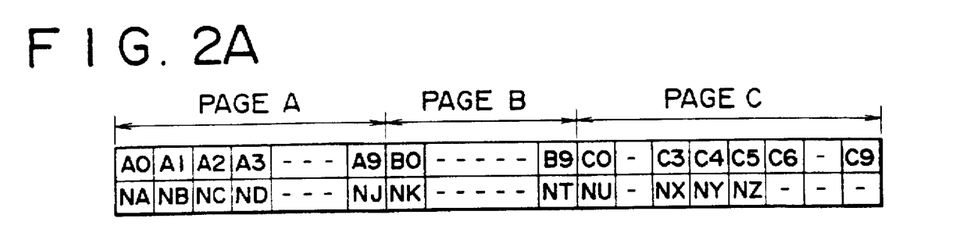
FIGS. 2A–2D is a diagram showing configuration of movement of data.
Figure 2B:
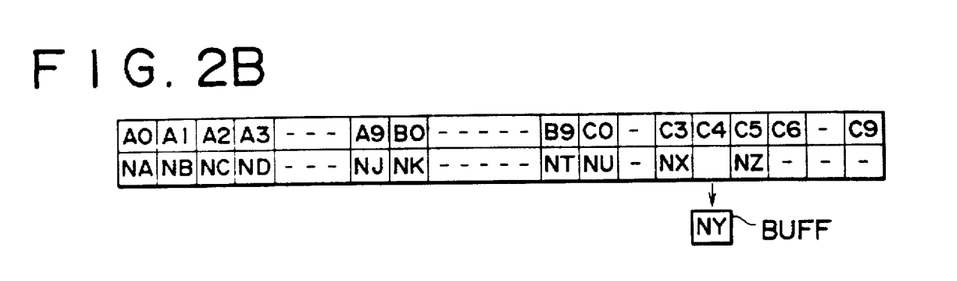

Further, this memory 44 has three pages A, B and C, and each page A, B and C has 10 pieces of data areas (addresses) A0 to A9, B0 to B9 and C0 to C9, respectively, as shown in FIG. 2A for instance. Then, FIG. 2A shows a case that frequency division ratios NA to NZ are written as data of receiving frequency in 26 pieces of data areas A0 to C5 from the head through the pages A to C.

Furthermore, ports 51 and 52 and a key interface circuit 53 are connected to the bus 49. The port 51 is connected to the frequency dividing circuit 22, and the frequency division ratio N from the CPU 41 is set to the frequency dividing circuit 22 through the port 51. Further, the detected signal S31 from the detection circuit 31 is taken into the microcomputer 40 through the port 52.

Furthermore, a menu key KM, an up-key KU, a down-key KD, an establishing key KE, a page key KP and station selector keys K0 to K9 for 10 stations' portion are connected to an interface circuit 53. Besides, when the page key KP selects the page A, B or C, the station selector keys K0 to K9 correspond to the data areas A0 to A9, B0 to B9 or C0 to C9 of the selected page A, B or C, respectively. Furthermore, any of the keys KM to K9 is composed of non-lock type push switch.

Further, a display controller 54 is connected to the bus 49, and an LCD 61 for instance is connected to this controller 54 as a display element. Then, when data for display are supplied from the CPU 41 to the controller 54, characters or the like corresponding to the data are displayed on the LCD 61.

In such a structure, respective operations are executed by processing with the microcomputer 40, as follows.

The station selecting mode is a mode of receiving broadcast normally, but is also a mode capable of performing station selection using the page key KP and the station selector keys K0 to K9.

Namely, when the page key KP is pushed, the pages A to C are selected cyclically A→B→C→A→..., and the station selector keys K0 to K9 are made to correspond to 10 pieces of data areas in the selected page whenever KP is pushed. For example, when the page A has been selected, the station selector keys K0 to K9 correspond to the data areas A0 to A9, respectively. At this time, the selected page is displayed on the LCD 61.

Then, in a state that a page in which an objective broadcasting station is preset is selected, when a station selector key Ki (i=any of 0 to 9) where the objective broadcasting station is preset among the station selector keys K0 to K9 is pushed, a frequency division ratio N which has been registered in a data area corresponding to the pushed key Ki is read out from that data area, and the read out frequency division ratio is set to the variable frequency dividing circuit 22 through the port 51, and thereafter, the receiving circuit 10 has a receiving frequency fRX corresponding to the set frequency division ratio.

Accordingly, when the station selector key Ki is pushed, it is possible to select the broadcasting station which is preset in the station selector key Ki in the selected page.

When the menu key KM is pushed at time of above-mentioned station selecting mode, a selecting mode for selecting various operation modes is produced, and, every time when the up-key KU or the down-key KD is pushed, the titles of the operation modes are displayed on the LCD 61 in a forward order or in a reverse order. Besides, when the selecting mode is turned to the station selecting mode from the selecting mode, it is returned to the station selecting mode when the angular menu key KM is pushed.

Then, when the establishing key KE is pushed when the objective operation mode is displayed, that operation mode becomes effective thereafter, and respective processings are carried out by the microcomputer 40 as follows.

The autopreset mode is a mode of automatically registering the frequency division ratio of the broadcasting stations capable of receiving in the data areas A0 to C9 of the pages A to C.

Namely, when the establishing key KE is pushed when the title of the autopreset mode is displayed on the LCD 61 in the selecting mode, the processing by the microcomputer 40 enters a scanning mode. Then, the frequency division ratio N of the variable frequency dividing circuit 22 is set to a minimal value 109 through the port 51, and the receiving frequency fRX of the receiving circuit 10 is set to the lowest frequency of 531 kHz.

Next, it is decided whether a broadcast wave signal SRX is being received or not by checking the level of the detected signal S31 through the port 52, and, when the broadcast wave signal SRX is not received, the frequency division ratio N of the variable frequency dividing circuit 22 is incremented by "1", and the receiving frequency fRX is raised by 9 kHz. Thus, the AM broadcast wave band is scanned at the frequency step of 9 kHz, and existence of the broadcast wave signal SRX is checked for each of respective frequencies.

Then, when the broadcast wave signal SRX could be received at a certain frequency, the frequency division ratio N that gives the receiving frequency fRX at that time is registered, i.e., written in the first data area of the page A, and thereafter, scanning is continued. In this manner, in the data areas A0 to C9 of the pages A to C, whenever the broadcast wave signal SRX can be received by scanning, the frequency division ratio N at that time is written successively from the area A0 at the head. FIG. 2A shows a case when frequency division ratios NA to NZ have been written starting from the data area A0 to the data area C5 in the pages A to C.

Then, when scanning is made up to the highest frequency 1,620 kHz or when the frequency division ratio N is written up to the last data area C9 of the page C, the scanning is terminated and the mode is returned to the normal operation mode.

Therefore, when this autopreset mode is executed, the frequency division ratio N of a broadcasting station capable of receiving is registered automatically in the data areas A0 to C9 of the pages A to C.

A data moving mode is a mode for moving a preset broadcasting station to another page or another station selector keys K0 to K9 by moving the frequency division ratio registered in the data areas A0 to C9 to another data area.

Besides, a case when the frequency division ratio NY of the data area C4 is moved to the data area A1 is described in the following explanation.

Namely, when the name of the moving mode, i.e., "MOVE" is displayed on the LCD 61 in the selecting mode, the processing of the microcomputer 40 enters in the moving mode when the establishing key KE is pushed.

Now, such operations are performed as described hereunder.

Figure 4A:
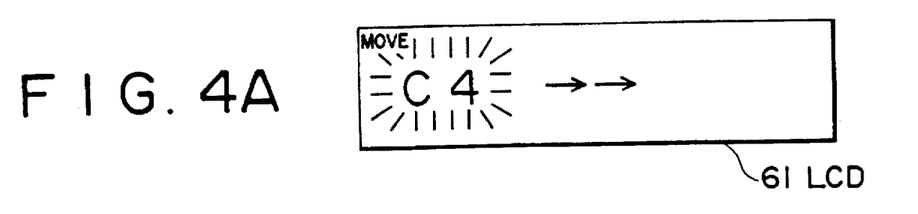
FIGS. 4A–4D is a diagram for explaining the present invention.

(1) Every time when the up-key KU is pushed, data areas are selected successively in forward order, and every time when the down-key KD is pushed, the data areas are selected successively in reverse order. Thus, the data area C4 which is the movement origin is selected by pushing the up-key KU or the down-key KD a predetermined times. At this time, the area name of the data area under selection is displayed with flashing on the left side of the LCD 61 as shown in FIG. 4A for instance.

Figure 4B:
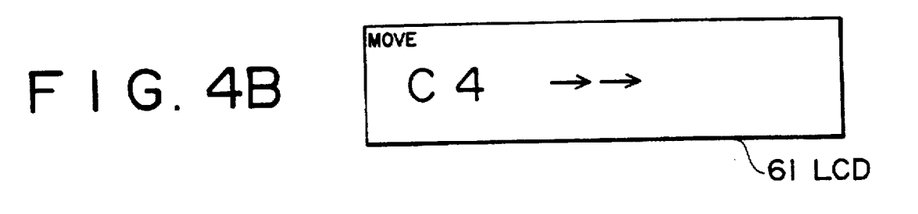

(2) The establishing key KE is pushed so as to establish the data area C4. When establishment is made, the area name is switched to continuous display from flashing display as shown in FIG. 4B.

Figure 4C:
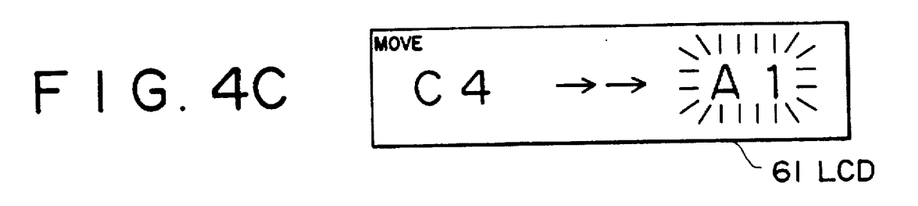

(3) The data area A1 of the movement destination is selected by pushing the up-key KU or the down-key KD several times. At this time, for a data area under selection, the area name thereof is displayed with flashing on the right side of the LCD 61 as shown in FIG. 4C for instance.

Figure 4D:
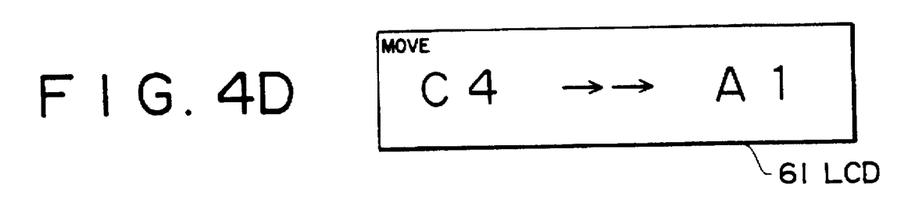

(4) The establishing key KE is pushed so as to establish the data area A1. When establishment is made, the area name becomes to be shown continuously as shown in FIG. 4D. Then, the mode is returned to the normal mode after two seconds for instance. Further, the display state and so on are changed as described above by this operation.

Then, when such an operation is performed, a processing such as shown in FIG. 2 is executed by means of the microcomputer 40, and a data moving mode is realized. Namely, when the data area C4 which is the movement origin is established by key operation stated in articles (1) and (2) when the contents of the pages A to C are in the state shown in FIG. 2A, the frequency division ratio NY of the data area C4 is saved (transferred) in the buffer area BUFF of the RAM 43 as shown in FIG. 2B and the data area C4 is made to be the first vacant area.

Figure 2C:
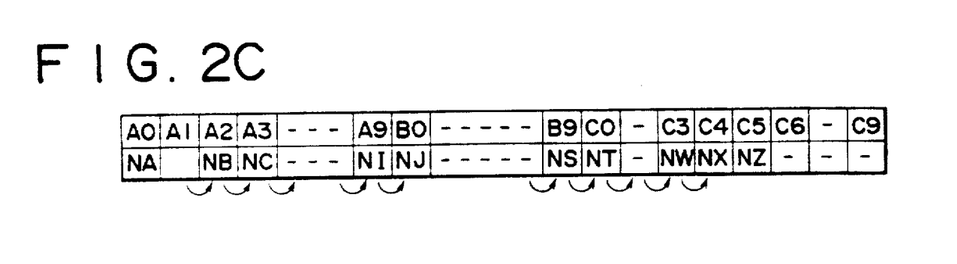

Then, when the data area A1 which is the movement destination is established by key operation stated in articles (3) and (4), a series of transfer processings such as:

a frequency division ratio NX of the data area C3 is transferred to the data area C4, a frequency division ratio NW of the data area C2 is transferred to the data area C3, . . .

the frequency division ratio NC of the data area A2 is transferred to the data area A3, and the frequency division ratio NB of the data area A1 is transferred to the data area A2, are executed as shown in FIG. 2C, and the data area A1 is made finally a vacant area for instance.

Figure 2D:
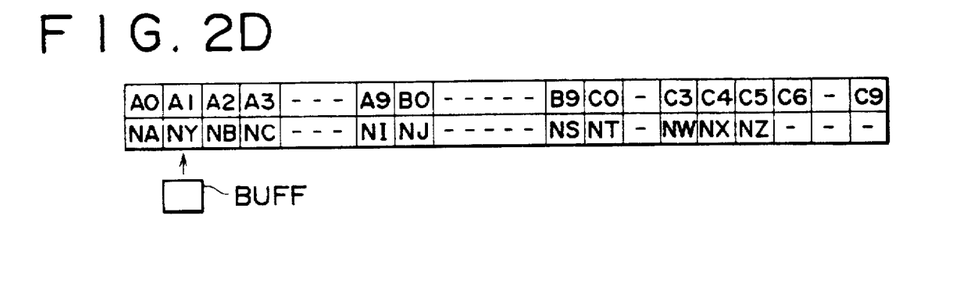

Then, the frequency division ratio NY which has been saved in the buffer area BUFF is returned (transferred) to the data area A1 thereafter as shown in FIG. 2D.

Thus, it means that the frequency division ratio NY that has been written in the data area C4 has been moved to the data area A1, that is, the broadcasting station which has been preset to the station selector key K4 of the page C has been moved to the station selector key K1 of the page A. Besides, at this time, midway broadcasting stations have been shifted backward one by one as the movement goes on without changing the order of preset.

Figure 3A:
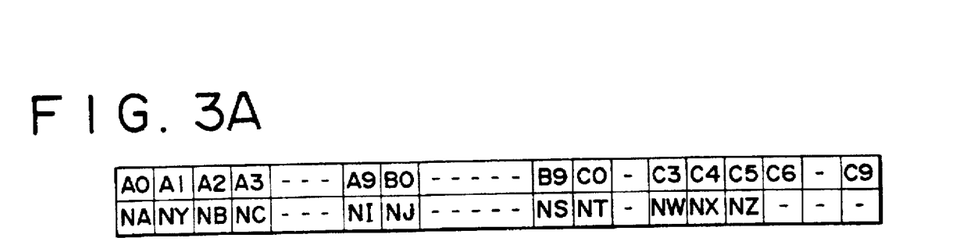
FIGS. 3A–3D is a diagram showing configuration of movement of data.
Figure 3B:
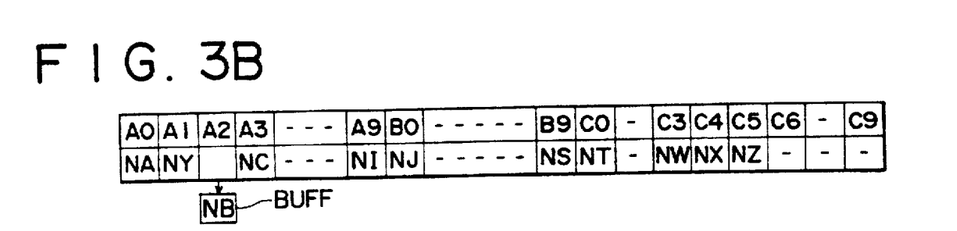

Then, in the above-mentioned case, the preset position of a broadcasting station is moved from the back to the front as shown in FIG. 2, but, when it is moved from the front to the back conversely to the above, it is to the following effect. Besides, in the explanation hereinafter, a case that the frequency division ratio NB of the data area A2 is moved to the data area C4 when the data areas A0 to C9 are in the state shown in FIG. 3A (same as FIG. 2D).

Further, such operations as described hereunder are also performed in this case.

(1) The data area A2 which is the movement origin is selected by pushing the up-key KU or the down-key KD several times, (2) the establishing key KE is pushed so as to establish the data area A2, (3) the data area C4 which is the movement destination is selected by pushing the up-key KU or the down-key KD several times, and (4) the establishing key KE is pushed so as to establish the data area C4.

Then, at this time, a processing such as shown in FIG. 3 is executed by means of the microcomputer 40, thus having realized a data moving mode. Namely, when the data area A2 which is the movement origin is established by key operations stated in articles (1) and (2) when the contents of the pages A to C are in the state shown in FIG. 3A, the frequency division ratio NB of the data area A2 is saved in the buffer area BUFF of the RAM 43 as shown in FIG. 3B.

Figure 3C:
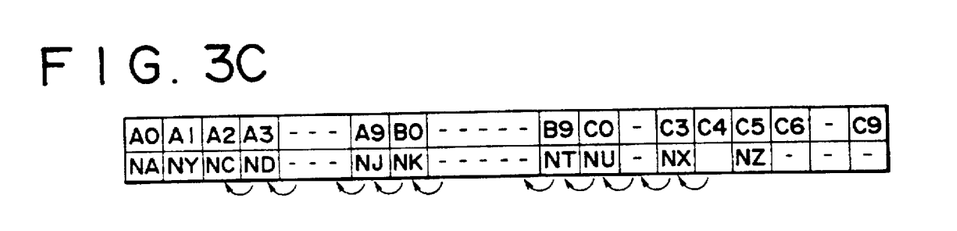

Then, when the data area C4 which is the movement destination is established by key operations stated in articles (3) and (4), such a series of transfer processings as:

The frequency division ratio NC of the data area A3 is transferred to the data area A2, the frequency division ratio ND of the data area A4 is transferred to the data area A3, . . .

the frequency division ratio NW of the data area C3 is transferred to the data area C2, and the frequency division ratio NX of the data area C4 is transferred to the data area C3, are executed and the data area C4 is made vacant for instance as shown in FIG. 3C.

Figure 3D:
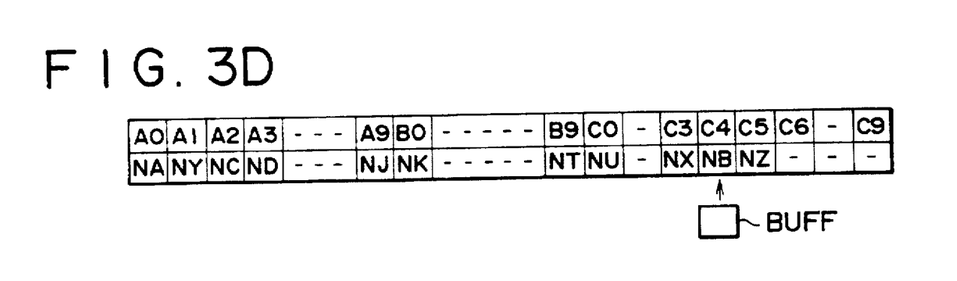

Then, the frequency division ratio NB which has been saved in the buffer area BUFF is returned thereafter to the data area C4 as shown in FIG. 3D.

Thus, it means that the frequency division ratio NB which has been written in the data area A2 has been moved to the data area C4, that is, it means that a broadcasting station which has been preset in the station selector key K2 of the page A has been moved to the station selector key K4 of the page C.

Besides, when the operations stated in articles (1) to (4) in FIG. 2 and FIG. 3 are combined, it means that a broadcasting station which has been preset to the station selector key K1 of the page A and a broadcasting station which has been preset to the station selector key K4 of the page C have been replaced with each other.

Collecting the foregoings and arranging them in order, both when the frequency division ratio is moved from the front to the back (FIG. 2) and when it is moved from the back to the front (FIG. 3), it is sufficient to perform such processings as described hereunder.

(11) The frequency division ratio of the movement origin is saved in the RAM 43.

(12) The frequency division ratio of the data area between the data area in which the frequency division ratio of the movement origin is registered and the data area (including this data area) of the movement destination is shifted by one data area at a time to the data area side of the movement origin.

(13) The frequency division ratio which has been saved is returned to the data area of the movement destination.

Then, by doing so, it is possible to realize the movement only by selecting and establishing a broadcasting station of the movement origin and selecting and establishing a broadcasting station of the movement destination.

As described above, it is possible to move a broadcasting station preset in the pages A to C and station selector keys K0 to K9 in the synthesizer receiver shown in FIG. 1, but it is sufficient in this case to perform such key operations as:

(1) the data area of the movement origin is selected, (2) the establishing key KE is pushed so as to establish the data area of the movement origin, (3) the data area of the movement destination is selected, and (4) the establishing key KE is pushed so as to establish the data area of the movement destination. Moreover, since the key operation is patternized, the key operation is simple.

Further, since movement is executed based on the objective broadcasting station, it will never happen that the frequency division ratio is erased by mistake. Furthermore, since the frequency division ratio that becomes an object of movement is saved in the buffer area BUFF of the RAM 43, it is possible to execute the movement even when the frequency division ratio is registered in all of the data areas A0 to C9 of the pages A to C.

Further, even when movement is performed, no influence is exerted upon the order of broadcasting stations between the movement origin and the movement destination and the result of movement may be imaged easily. Therefore, it is possible to arrange the preset in the favorable order for a user.

Besides, it has been arranged in the foregoing to select the data area of the movement origin or the movement destination by the up-key KU and the down-key KD, but it is also possible to select the data area by means of the page key KP and station selector keys K1 to K9. Otherwise, it is also possible to provide a rotary encoder, and to have the outputs when the rotary shaft thereof is rotated clockwise and counterclockwise correspond to the outputs when the up-key KU and the down-key KD are pushed.

Further, it was arranged in the foregoing to enter in the selecting mode by means of the menu key KM and to further enter in the data moving mode from the selecting mode, but it is also possible to provide an exclusive key for movement and to enter the moving mode when the movement key thereof is pushed.

Furthermore, it has been described above that the frequency division ratio of the movement origin is saved in the buffer area BUFF by key operations stated in articles (1) and (2), and the frequency division ratio in the buffer area BUFF is returned to the data area of the movement destination by key operations stated in articles (3) and (4), but it is also possible to arrange so that the frequency division ratio of the movement origin is saved in the buffer area BUFF by key operations stated in articles (1) to (4), and thereafter, the frequency division ratio in the buffer area BUFF is returned to the data area of the movement destination.

Further, it has been stated that the data area A1 becomes vacant by transfer of the frequency division ratio in FIG. 2C for instance. Since practical write of the frequency division ratio in a memory 44 is performed by superscription, however, the data area needs not to become vacant, and the same is applied to the other data areas.

Furthermore, a case that the receiving circuit 10 receives AM broadcasting has been described above, but it is also possible to structure in a similar manner when FM broadcasting or television broadcasting (in particular the aural signal thereof). Further, when a broadcasting station name can also be registered as the case of FM broadcasting executing Radio Data System (RDS) or when the broadcasting station name can also be registered by key input from a user, the data of the broadcasting station name may be processed together with the frequency division ratio N as a set. Further, in that case, the broadcasting station name of the movement origin can also be displayed in place of displaying the data area of the movement origin.

According to the present invention, when a preset broadcasting station is moved, the key operation thereof is simple. Further, even when a mistake is made in key operation, the frequency data will never be erased. Furthermore, even when the frequency data are registered in all of the data areas, movement can be carried out. Also, it is possible to arrange preset in the order favorable for a user.

What is claimed is:

1. A synthesizer receiver for performing frequency conversion of a received signal using a signal formed in a PLL and altering a frequency division ratio of a variable frequency dividing circuit of said PLL, thereby to alter the frequency of said signal so as to change a receiving frequency, comprising:

memories for storing data of said receiving frequency in each of a plurality of data areas;

station selecting means having a plurality of station selector keys corresponding to said plurality of data areas of said memories, wherein, from a data area corresponding to said operated station selector key, said received data stored in this data area are read out, said frequency division ratio of said frequency dividing circuit is set in accordance with the read out data, and a receiving frequency preset to said operated station selector key is selected; and data moving means having a buffer area for saving data of said receiving frequency stored in said data area, wherein, when one data area among said plurality of data areas is selected and established and another data area among said plurality of data areas is selected and established, the data of the receiving frequency stored in said one data area are saved in said buffer area, so as to form one vacant area in said one data area, the data of said receiving frequency stored in said data area are shifted to the side of said one data area so as to form another vacant area in said another data area, and said receiving frequency data which have been saved in said buffer area are returned to said another data area.

2. A synthesizer receiver according to claim 1, wherein the data moving means has a buffer area for saving the data of said receiving frequency stored in said data area, and, when one data area among said plurality of data areas is selected and established and another data area among said plurality of data areas is selected and established, the data of the receiving frequency stored in said one data area are saved in said buffer area so as to form one vacant area in said one data area, the receiving frequency data stored in said another data area are shifted to the side of said one data area so as to form another vacant area in said another data area, and said receiving frequency data which have been saved in said buffer area are returned to said another data area.

3. A synthesizer receiver according to claim 1, further comprising a display element, wherein:

when said one data area is selected, the data related to this selected data area are displayed on said display element; and when said another data area is selected, the data related to this selected data area are displayed on said display element.

\* \* \* \* \*